(12) United States Patent
Kajino et al.

(10) Patent No.: US 6,793,769 B2
(45) Date of Patent: Sep. 21, 2004

(54) SUBSTRATE PROCESSING APPARATUS

(75) Inventors: Itsuki Kajino, Kyoto (JP); Hideki Adachi, Kyoto (JP)

(73) Assignee: Dainippon Screen Mfg. Co. Ltd. (JP)

( * ) Notice: Subject to any disclaimer, the term of this patent is extended or adjusted under 35 U.S.C. 154(b) by 23 days.

(21) Appl. No.: 10/281,473

(22) Filed: Oct. 25, 2002

(65) Prior Publication Data

US 2003/0079835 A1 May 1, 2003

(30) Foreign Application Priority Data

Oct. 30, 2001 (JP) .................................. P2001-332108
Sep. 19, 2002 (JP) .................................. P2002-273190

(51) Int. Cl.[7] ...................... H01L 21/304; H01L 21/306
(52) U.S. Cl. .................................. 156/345.55; 134/33
(58) Field of Search ................ 134/33, 34; 156/345.55

(56) References Cited

U.S. PATENT DOCUMENTS

| | | | |
|---|---|---|---|
| 4,903,717 A | * 2/1990 | Sumnitsch | 134/99.1 |
| 4,968,375 A | * 11/1990 | Sato et al. | 156/345.23 |
| 5,608,943 A | * 3/1997 | Konishi et al. | 15/302 |
| 5,845,662 A | * 12/1998 | Sumnitsch | 134/153 |
| 5,879,576 A | * 3/1999 | Wada et al. | 216/91 |
| 5,896,877 A | 4/1999 | Pirker | 134/153 |
| 6,416,579 B1 | * 7/2002 | Thallner | 118/323 |
| 6,435,200 B1 | * 8/2002 | Langen | 134/99.1 |
| 6,669,808 B2 | * 12/2003 | Adachi et al. | 156/345.11 |

FOREIGN PATENT DOCUMENTS

| | | |
|---|---|---|
| JP | 5-14791 | 2/1993 |
| JP | 10-189511 | 7/1998 |
| JP | 10-237678 | 9/1998 |
| JP | 11-176795 | 7/1999 |

* cited by examiner

*Primary Examiner*—Gregory Mills
*Assistant Examiner*—Sylvia R. MacArthur
(74) *Attorney, Agent, or Firm*—Ostrolenk, Faber, Gerb & Soffen, LLP

(57) ABSTRACT

A substrate processing apparatus injects gas from an injection port formed on a shielding surface of an atmosphere shielding part and sucks a substrate by Bernoulli effect. The substrate is sucked in a state coming into contact with a contact supporting surface of a support member provided on the atmosphere shielding part, and rotated with the upper surface shielded by a shielding surface of the shielding part. A solution supply part supplies a chemical solution to the lower surface of the substrate. Therefore, mist of a processing solution or the processing solution can be reliably prevented from reaching the upper surface of the substrate. Thus provided is a substrate processing apparatus capable of reliably preventing the mist of the processing solution or the processing solution from reaching the upper surface of the substrate.

8 Claims, 8 Drawing Sheets

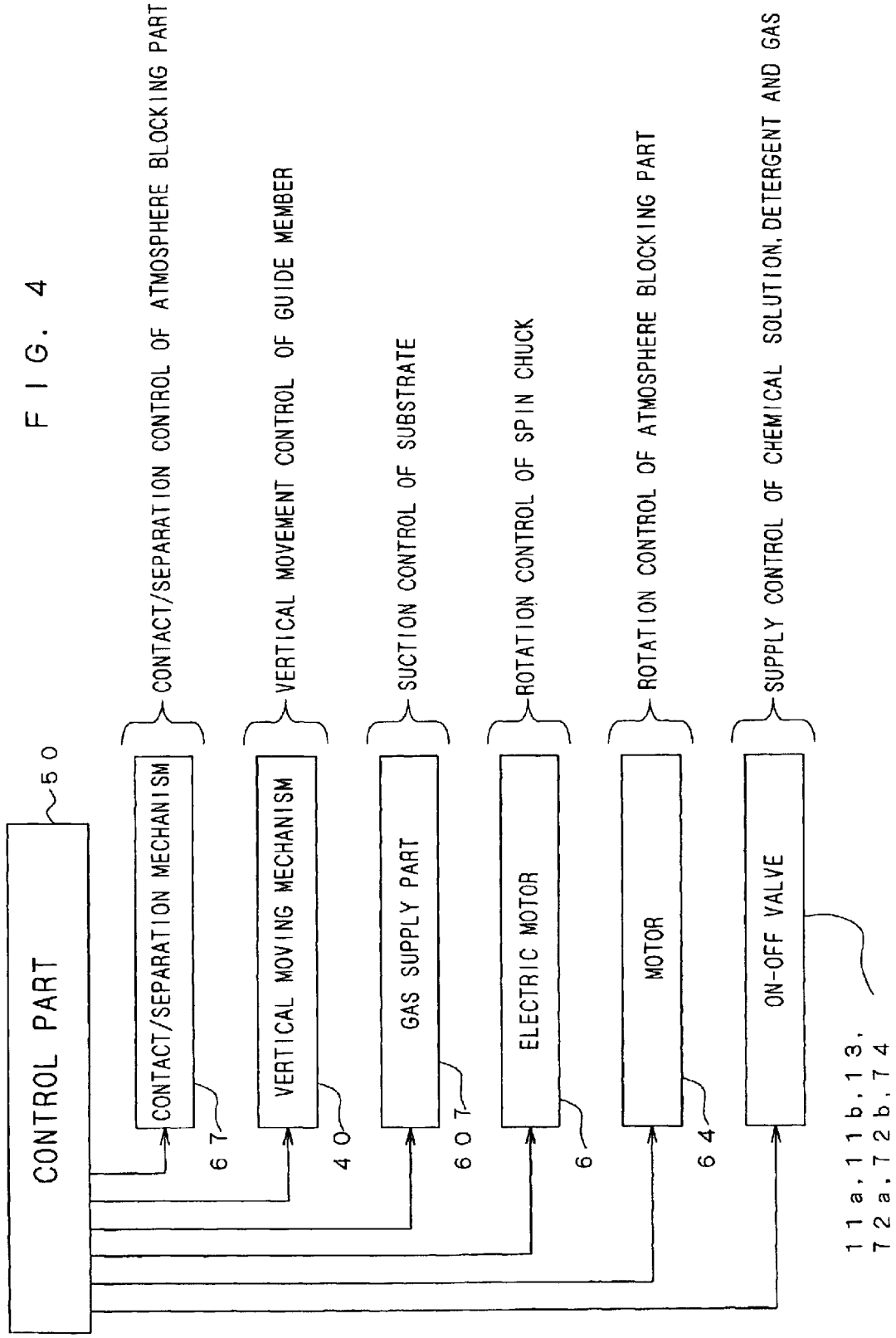

SUBSTRATE PROCESSING APPARATUS

BACKGROUND OF THE INVENTION

1. Field of the Invention

The present invention relates to a substrate processing apparatus holding a substrate such as a glass substrate for a liquid crystal display or a semiconductor wafer and rotating the same about a vertical axis for performing required processing such as cleaning processing or drying processing.

2. Description of the Background Art

When a processing solution such as an etching solution is supplied to the lower surface of a substrate such as a semiconductor wafer horizontally rotated about a vertical axis, mist of the processing solution scattered during the processing may reach the upper surface of the substrate to adhere thereto or the processing solution supplied to the lower surface of the substrate may reach the upper surface of the substrate from the peripheral edge thereof.

In order to solve this problem, generally proposed is a substrate processing apparatus approaching a blocking member to the upper surface of the substrate for defining a narrow space between the upper surface of the substrate and the blocking member and introducing inert gas such as nitrogen gas into the space thereby preventing the mist of the processing solution or the processing solution from reaching the upper surface of the substrate.

FIG. 9 is a model diagram schematically showing the structure of a principal part of an exemplary conventional substrate processing apparatus having the aforementioned structure. A substrate W is positioned by a plurality of, e.g., three support pins 202 provided on a rotary base member 201, to be horizontally supported. The rotary base member 201, fixed to the upper end of a rotary spindle 203 rotatably supported and rotated about a vertical axis by a motor (not shown), is rotated while holding the substrate W.

A blocking member 204 consisting of a circular plate equivalent in size to the substrate W is arranged above the rotary base member 201, mounted on a suspension arm 205 and horizontally held. The suspension arm 205 is vertically movably supported to be capable of approaching the blocking member 204 to the substrate W and upwardly separating the former from the latter. A gas outlet 206 is provided on the central portion of the blocking member 204 for injecting inert gas such as nitrogen gas toward the upper surface of the substrate W. The suspension arm 205 is formed on its axial portion with a gas introduction passage 207, communicating with the gas outlet 206, connected to a gas supply pipe (not shown).

A processing solution nozzle 208 is arranged under the rotary base member 201 for supplying a processing solution such as an etching solution, a developer or a detergent to the lower surface of the substrate W in response to the contents of processing. A cup (not shown) is vertically movably arranged around the rotary base member 201 for preventing the processing solution from scattering, and a discharge/exhaust pipe is provided on the bottom portion of this cap for discharging the processing solution recovered in the cup from the substrate processing apparatus and exhausting the cup.

In order to process the substrate W in the substrate processing apparatus having the aforementioned structure, the blocking member 204 is approached to the substrate W supported by the support pins 202 provided on the rotary base member 201 for rotating the substrate W and supplying the processing solution to the lower surface of the substrate W. At this time, the inert gas is injected toward the upper surface of the substrate W from the gas outlet 206 of the blocking member 204 to be introduced into and purge the space between the upper surface of the substrate W and the blocking member 204.

The inert gas introduced into the space between the substrate W and the blocking member 204 flows toward the peripheral edge of the substrate W, and is injected outward from the peripheral edge of the substrate W. Therefore, mist of the processing solution scattered from the peripheral edge of the substrate W is forced back by the flow of the inert gas outwardly injected from the peripheral edge of the substrate W not to penetrate into the space between the substrate W and the blocking member 204, and the processing solution supplied to the lower surface of the substrate W is prevented by the flow of the inert gas from reaching the upper surface of the substrate W from the peripheral edge of the substrate W.

However, the prior art having such a structure has the following problems: In the aforementioned substrate processing apparatus approaching the blocking member 204 to the upper surface of the substrate W for purging the space between the substrate W and the blocking member 204 by introducing the nitrogen gas, the blocking member 204 must be approached to the upper surface of the substrate W as close as possible in order to effectively prevent the scattered mist and the processing solution from reaching the upper surface of the substrate W. However, the distance capable of approaching the blocking member 204 to the upper surface of the substrate W without coming into contact with the rotated substrate W is limited due to mechanical accuracy of the blocking member 204. In the structure approaching the blocking member 204 to the upper surface of the substrate W, therefore, the mist of the processing solution or the processing solution cannot necessarily be sufficiently prevented from reaching the upper surface of the substrate W.

Particularly when the substrate processing apparatus processes a large-diameter substrate and supplies the processing solution substantially to the central position of the lower surface of the substrate, the central portion of the substrate is convexly protruded due to the injection pressure of the processing solution. Such deformation of the substrate during processing makes approximation of the substrate W and the blocking member 204 further difficult.

The aforementioned substrate processing apparatus is also employed for substrate processing referred to as bevel etching. In this processing, a processing solution Q is discharged toward the lower surface, formed with no device, of a substrate W as shown in FIG. 10 so that the processing solution Q transferred from the center to the periphery of the lower surface centrifugally reaches the upper surface for processing a peripheral area RA of the outer peripheral edge of the upper surface of the substrate W.

Thus, the substrate processing apparatus carries out a substrate processing method of processing the overall lower surface and the outer peripheral edge of the substrate W or the overall lower surface, the outer peripheral edge and the peripheral portion of the upper surface of the substrate W. In other words, the processing solution Q processes only the peripheral portion of the upper surface of the substrate W. More specifically, the substrate processing apparatus processes a substrate plated with copper on the overall upper surface, for removing the copper plating from the overall lower surface and only the peripheral portion of about 1 to 7 mm, for example, of the upper surface.

On the other hand, the conventional support pins 202 supporting the substrate W on the rotary base member 201 include mechanical chucks holding the outer peripheral edge of the substrate W with members consisting of pawls or rings so that the substrate W does not centrifugally spring out. Holding power of the mechanical chucks utilizes mechanical force of urging means consisting of springs or the like. This holding power is canceled by driving cancel means provided on the rotary base member 201.

However, the bevel etching employing such mechanical chucks has the following problem: The plurality of support pins 202 hold the outer peripheral edge of the substrate W during the processing, and hence the processing solution does not reach a part, located in the vicinity thereof, of the peripheral portion of the upper surface of the substrate W. Therefore, the peripheral portion of the upper surface of the substrate W cannot be homogeneously processed.

Further, it follows that the cancel means for the mechanical chucks provided on the rotary base member 201 is soaked with a large quantity of processing solution during the processing. When the cancel means is wetted with the processing solution, a driving system related to the cancel means is corroded to cause a defect in the operation of the cancel means. Therefore, a new chucking system capable of preventing irregular processing is desired.

SUMMARY OF THE INVENTION

The present invention is directed to a substrate processing apparatus processing a substrate by supplying a processing solution to the substrate while rotating the same.

According to the present invention, the substrate processing apparatus comprises a proximity suction part injecting gas from a hole provided on a supporting surface opposed to the upper surface of the substrate thereby sucking the substrate through Bernoulli effect, a rotation part rotating the proximity suction part about a vertical axis, a support member uprightly provided on the supporting surface of the proximity suction part for coming into contact with the peripheral portion of the substrate when the proximity suction part sucks the substrate thereby transmitting the driving force of the rotation part to the substrate and a processing solution supply part supplying a processing solution to the lower surface of the substrate rotated in contact with the support member.

Mist of the processing solution or the processing solution can be reliably prevented from reaching the upper surface of the substrate.

Preferably, the substrate processing apparatus further comprises a contact position changing part changing the position of the substrate coming into contact with the contact supporting surface, and the processing solution supply part supplies the processing solution to the substrate before and after changing the position coming into contact with the contact supporting surface.

Homogeneous processing can be performed by preventing irregular processing resulting from holding of the support member.

According to another aspect of the present invention, the substrate processing apparatus comprises a proximity suction part injecting gas from a hole provided on a supporting surface opposed to the upper surface of the substrate thereby sucking the substrate through Bernoulli effect, a rotation part rotating the proximity suction part about a vertical axis, a support member uprightly provided on the supporting surface of the proximity suction part for coming into contact with the upper surface of the substrate when the proximity suction part sucks the substrate thereby transmitting the driving force of the rotation part to the substrate and a processing solution supply part supplying a processing solution to the lower surface of the substrate rotated in contact with the support member, while the support member is so arranged that the forward end of the support member comes into contact with a clearance between a processing area where the processing solution supplied to the lower surface of the substrate reaches a peripheral upper surface of the substrate for performing processing and an effective area where a device pattern is formed when the proximity suction part sucks the substrate.

Mist of the processing solution or the processing solution can be reliably prevented from reaching the upper surface of the substrate, and homogeneous processing can be performed by preventing irregular processing resulting from holding of the support member while bringing the support member into contact with the substrate.

Accordingly, an object of the present invention is to provide a substrate processing apparatus capable of reliably preventing mist of a processing solution or the processing solution from reaching the upper surface of a substrate.

Another object of the present invention is to provide a substrate processing apparatus capable of performing homogeneous processing by preventing irregular processing resulting from holding of a substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a block diagram showing the structure of a control system for the apparatus according to the first embodiment;

DESCRIPTION OF THE PREFERRED EMBODIMENTS

Embodiments of the present invention are now described in detail with reference to the accompanying drawings.

First Embodiment

Figure 1:
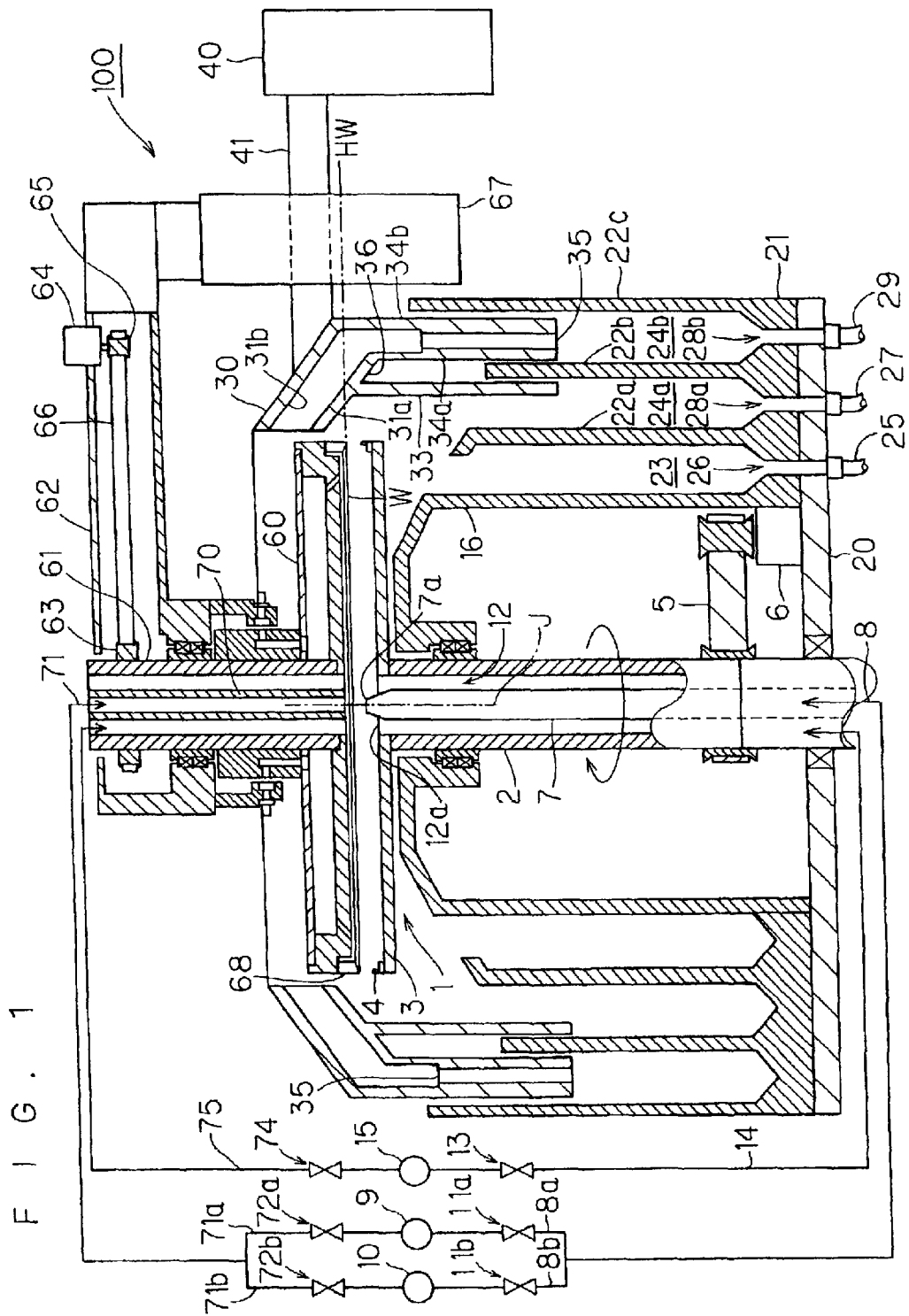
FIG. 1 is a longitudinal sectional view showing the structure of a substrate processing apparatus according to a first embodiment of the present invention.
Figure 2:
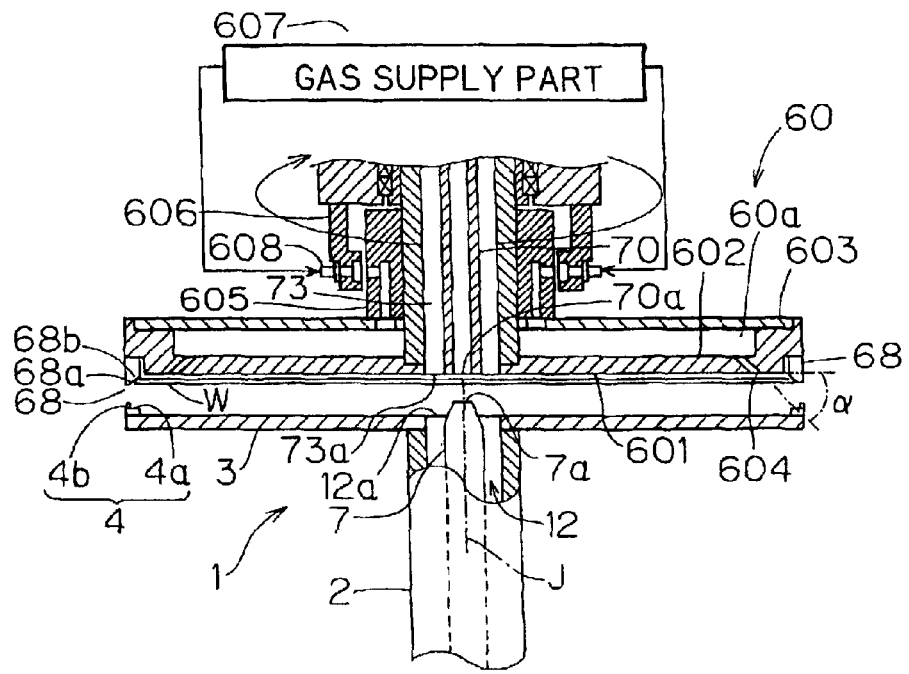
FIG. 2 is an enlarged sectional view showing an atmosphere shielding part of the aforementioned substrate processing apparatus.

FIG. 1 is a longitudinal sectional view showing the structure of a substrate processing apparatus 100 according to a first embodiment of the present invention. FIG. 2 is an enlarged sectional view showing a principal part of an atmosphere shielding part 60 of the substrate processing apparatus 100 shown in FIG. 1. This apparatus 100 is employed for performing rotation processing on a circular semiconductor wafer (substrate) W to be processed with a chemical solution or deionized water, and the substrate prosing apparatus 100 supplies the chemical solution such as a chemical or an organic solvent or the deionized water (hereinafter referred to as "processing solution") while rotating the substrate W in a plane parallel to the main surface thereby processing the surface of the substrate W. The substrate processing apparatus 100 can perform various processing including bevel etching on the lower surface of the substrate W, and is enabled to also process the upper surface of the substrate W.

Referring to FIG. 1, the substrate processing apparatus 100 processes the lower surface of the substrate W. The lower surface of the substrate W is opposed to a spin chuck 1, while the upper surface thereof is opposed to the atmosphere shielding part 60. The substrate W is transferred to the spin chuck 1 while the atmosphere shielding part 60 is retracted, and the atmosphere shielding part 60 thereafter moves to approach to the substrate W and injects inert gas (hereinafter simply referred to as "gas") such as nitrogen gas. The substrate W is supported in a state extremely approaching to the atmosphere shielding part 60 due to Bernoulli effect resulting from flow of the gas. In other words, the atmosphere shielding part 60 serves as a support supporting the substrate W from above.

The spin chuck 1 temporarily horizontally holds the substrate W. This spin chuck 1 has a platelike spin base 3 serving as a rotary supporting plate integrally rotatably mounted on the upper end of a rotary shaft 2. At least three holding pins 4 holding the outer peripheral edge of the substrate W on at least three portions are uprightly provided on the upper surface of the spin base 3 at regular intervals along the peripheral edge of the spin base 3. Each of FIGS. 1 and 2 shows only two holding pins 4, in order to avoid complicatedness of the drawing.

Each holding pin 4 comprises a supporting surface 4a supporting the outer peripheral edge of the substrate W from below and a guide upstanding surface 4b coming into contact with the outer peripheral end surface of the substrate W supported by the supporting surface 4a for regulating movement of the substrate W.

An electric motor 6 serving as rotation means with a belt driving mechanism 5 and the like is interlocked/coupled with a portion around the lower end of the rotary shaft 2. The electric motor 6 is so driven as to rotate the rotary shaft 2 and the spin chuck 1 about a vertical axis J.

The rotary shaft 2 is formed by a cylindrical member having a hollow portion receiving a solution supply pipe 7 so that a solution supply part 7a provided on its upper end can supply the processing solution to a portion around the rotation center of the lower surface of the substrate W held by the atmosphere shielding part 60. The solution supply pipe 7 is communicatively connected to a pipe 8. The base end of the pipe 8 is so branched that a chemical solution supply source 9 is communicatively connected to a first branch pipe 8a and a deionized water supply source 10 is communicatively connected to a second branch pipe 8b. The branch pipes 8a and 8b are provided with on-off valves 11a and 11b respectively so that the solution supply part 7a can selectively switch and supply the chemical solution and the deionized water by switching the on-off valves 11a and 11b.

The clearance between the inner wall surface of the hollow portion of the rotary shaft 2 and the outer wall surface of the solution supply pipe 7 defines a gas supply passage 12. The gas supply passage 12 is communicatively connected to a gas supply source 15 through a pipe 14 provided with an on-off valve 13, so that clean gas such as clean air or clean inert gas (e.g., nitrogen gas) can be supplied from a gas supply part 12a provided on the upper end of the gas supply passage 12 to the space between the spin base 3 and the lower surface of the substrate W.

A cylindrical casing 16 provided on a base member 20 stores the rotary shaft 2, the belt driving mechanism 5, the electric motor 6 and the like.

A receiving member 21 is fixedly mounted on the periphery of the casing 16 provided on the base member 20. Cylindrical partition members 22a, 22b and 22c are uprightly provided on the receiving member 21 for forming an exhaust tank 23, a first discharge tank 24a and a second discharge tank 24b by the partition members 22a, 22b and 22c and the outer wall surface of the casing 16 respectively. The space between the outer wall surface of the casing 16 and the inner wall surface of the inner partition member 22a defines the exhaust tank 23, the space between the outer wall surface of the inner partition member 22a and the inner wall surface of the intermediate partition member 22b defines the first discharge tank 24a, and the space between the outer wall surface of the intermediate partition member 22b and the inner wall surface of the outer partition member 22c defines the second discharge tank 24b.

An exhaust port 26 communicatively connected to an exhaust duct 25 is provided on the bottom of the exhaust tank 23 so that gas is sucked from the exhaust tank 23 through the exhaust port 26. A first discharge port 28a communicatively connected to a recovery drain 27 is provided on the bottom of the first discharge tank 24a, while a second discharge port 28b communicatively connected to a waste drain 29 is provided on the bottom of the second discharge tank 24b.

FIG. 1 shows only the sectional shapes of the partition member 22a to 22c and a guide member 30 described later, in order to avoid complicatedness of the drawing.

The cylindrical guide member 30 is vertically movably provided above the first and second discharge tanks 24a and 24b to enclose the spin chuck 1 and the atmosphere shielding part 60. Inclined portions 31a and 31b upwardly reduced in diameter are formed on the guide member 30. The inclined portions 31a and 31b are concentrically arranged at a space from each other.

Vertical portions 33 and 34a are connected to the lower end of the inclined portion 31a, while a vertical portion 34b is connected to the lower end of the inclined portion 31b. The inclined portions 31a and 31b are coupled with each other through the vertical portions 34a and 34b, and a large number of openings 35 forming discharge guide passages are circumferentially bored on the coupled portion. The guide member is also formed with an annular groove 36 between the vertical portions 33 and 34a, and is so arranged that the intermediate partition member 22b is engaged into the groove 36 and the vertical portions 34a and 34b are engaged into the second discharge tank 24b.

When the inclined portion 31a is located on a vertical position HW of the substrate W supported by the atmosphere shielding part 60, it follows that the processing solution scattered from the rotated substrate W is received in the inclined portion 31a, guided to the first discharge tank 24a along the inclined portion 31a and the vertical portion 33, and discharged from the first discharge port 28a. This apparatus 100 employs the inclined portion 31a, the vertical portion 33, the first discharge tank 24a and the first discharge port 28a for recovering the chemical solution from the first discharge port 28a to a recovery tank (not shown) through a recovery drain 27, so that the chemical solution recovered from the recovery tank is supplied to the chemical solution supply source 9 to be recycled.

When the inclined portion 31b is located on the vertical position HW of the substrate W held by the atmosphere shielding part 60, it follows that the processing solution scattered from the rotated substrate W is received in the inclined portion 31b, flows along the inclined portion 31b and the vertical portion 34b, is guided from the openings 35 to the second discharge tank 24b, discharged from the second discharge port 28b, and discarded through the waste drain 29. This apparatus 100 employs the inclined portion 31b, the vertical portion 34b, the opening 35, the second discharge tank 24b and the second discharge port 28b for discarding waste water (deionized water mixed with the chemical solution) after cleaning processing, so that the waste water is discarded from the second discharge port 28b through the waste drain 29.

The guide member 30 is coupled to a vertical moving mechanism 40. The vertical moving mechanism 40 supports the guide member 30 through a support member 41. A motor (not shown) is driven to vertically move the vertical moving mechanism 40, thereby vertically moving the guide member 30.

The guide member 30 is vertically moved between three stages of vertical positions, i.e., a first vertical position H1 for locating the inclined portion 31a on the vertical position HW of the substrate W held by the atmosphere shielding part 60, a second vertical position H2 for locating the inclined portion 31b on the vertical position HW of the substrate W and a third vertical position H3 for locating the upper end of the guide member 30 downward beyond the spin base 3 for introducing the substrate W. Sensors for vertical movement detection are arranged on vertical positions of the vertical moving mechanism 40 corresponding to the aforementioned first to third vertical positions H1 to H3 (see FIGS. 5(A) to 5(C)) of the guide member 30, so that the motor is driven/controlled on the basis of detection signals from these sensors for locating the guide member 30 on any of the first to third vertical positions H1 to H3. A control part 50 functioning as vertical movement control means performs this vertical movement control, as sown in FIG. 4.

Referring again to FIG. 1, the atmosphere shielding part 60 is arranged above the spin chuck 1. This atmosphere shielding part 60 has a diameter slightly larger than that of the substrate W as shown in FIG. 2 in an enlarged manner, and is integrally rotatably mounted on the lower end of a cylindrical rotary shaft 61 having a hollow portion. At least three support members 68 coming into contact with the outer periphery of the substrate W on at least three portions are uprightly provided on the lower surface of the atmosphere shielding part 60 at regular intervals along the peripheral edge of the atmosphere shielding part 60. Each of FIGS. 1 and 2 shows only two support members 68, in order to avoid complicatedness of the drawing.

Figure 3:
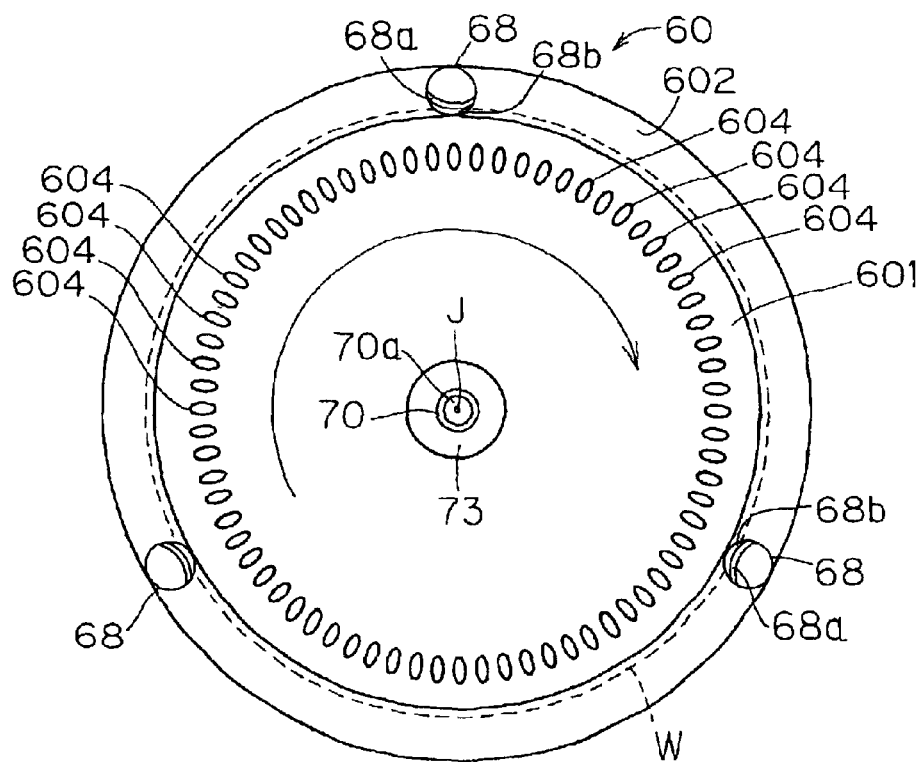
FIG. 3 is a bottom plan view of the atmosphere shielding part of the aforementioned substrate processing apparatus.

Description is made also with reference to FIG. 3. FIG. 3 illustrates the lower surface of the atmosphere shielding part 60. Each support member 68, provided in the form of a bar perpendicular to the atmosphere shielding part 60, has an upstanding surface 68a outwardly inclined toward the forward end and a contact supporting surface 68b having an upwardly inclined side closer to the center of the substrate W. The upstanding surface 68a serves as a member coming into contact with the outer peripheral end of the substrate W for regulating the moving range of the substrate W in a horizontal plane. The contact supporting surface 68b linearly comes into contact with a corner portion of the peripheral upper surface of the substrate W and is pressed by the peripheral upper surface thereby transmitting the torque of the atmosphere shielding part 60 to the substrate W. The contact supporting surface 68b may come into contact with the substrate W on any portion of a non-effective area, formed with no device pattern, around the upper surface of the substrate W, or the former may come into contact with the latter on a plane.

The atmosphere shielding part 60 is formed by a shielding member 602 having a shielding surface 601 opposed to the upper surface of the substrate W and a lid member 603 covering the upper portion of the shielding member 602. The shielding member 602 provided in the form of a dish is engaged with the lid member 603 thereby defining a space 60a in the atmosphere shielding part 60.

A plurality of injection ports 604 are formed on the lower portion of the shielding member 602 to obliquely extend from the space 60a toward the shielding surface 601, for vigorously injecting gas supplied to the space 60a toward the outer periphery of the upper surface of the substrate W. In other words, the space 60a partially forms a passage guiding the gas to the injection ports 604.

A passage member 605 and a supply port 606 are provided on the upper portion of the atmosphere shielding part 60 for supplying the gas to the space 60a, and the supply port 606 is supplied with the gas from a gas supply part 607 through a tube 608. The passage member 605 is mounted on the rotary shaft 61, the supply port 606 covers the outer periphery of the passage member 605, and a small clearance is provided between the passage member 605 and the supply port 606. This structure enables the supply port 606 fixed/set while rotating the rotary shaft 61 and the passage member 605 to regularly supply the gas toward a passage in the passage member 605. These form gas supply means according to the present invention.

A large number of (preferably at least 30) small injection ports 604 are formed on the shielding surface 601 of the shielding member 602 along the peripheral edge of the substrate W. More specifically, circular injection ports 604 of about 0.3 to 1 mm in diameter are annularly formed at regular intervals in the range of 1 to 6 mm on a section perpendicular to the hole forming direction (the extensional direction of the holes). The injection ports 604 are inclined toward the outer edge of the substrate W (see FIG. 2). Preferably, the injection ports 604 are formed in the range of an angle $\alpha$ of 20° to 40° with respect to the shielding surface 601. When the injection ports 604 vigorously inject the gas, therefore, the shielding surface 601 sucks the substrate W due to Bernoulli effect. Thus, the shielding surface 601 serves as a supporting surface for the substrate W.

At this time, the shielding surface 601 sucks the substrate W until the peripheral portion of the upper surface of the substrate W formed with a device, i.e., the outer side of an effective formation range for the device which is the shielding surface 601 of the shielding member 602 comes into contact with the contact supporting surfaces 68b of the support members 68. Consequently, the substrate W is supported from above in a state separated from the shielding surface 601 by about 0.4 mm.

The large number of small injection ports 604 are formed at regular intervals oppositely to the peripheral edge of the substrate W, whereby homogeneous gas flow can be formed on the peripheral edge of the substrate W at a high speed while suppressing consumption of the gas also when the substrate W is large-sized, for implementing stable support of the substrate W. The gas supply part 607 can change the suction force for the substrate W by adjusting the quantity of the gas injected from the injection ports 604.

The shielding member 602 is integrally molded by resin having corrosion resistance against the processing solution. Preferably, the shielding member 602 is integrally molded by PVC (polyvinyl chloride) or hard fluorocarbon resin such as PCTFE (polychlorofluoroethylene) or PEEK (polyether (etherketone)) having higher mechanical strength than fluorocarbon resin. The injection ports 604 may be formed in integral molding, or may be formed in the prototype of the shielding member 602 with a drill. In either case, the shielding member 602 having precise injection ports 604 can be readily manufactured. Consequently, improvement of capability and stabilization can be attained while reducing the manufacturing cost for the substrate processing apparatus 100.

The shielding member 602, the injection ports 604 and the gas supply means of the aforementioned atmosphere shielding part 60 form proximity suction means according to the present invention.

The rotary shaft 61 is rotatably supported by a support arm 62. A follower pulley 63 is integrally rotatably mounted on the rotary shaft 61. An endless belt 66 is extended between the follower pulley 63 and a driving pulley 65 coupled to the driving shaft of a motor 64 to form rotation means according to the present invention for driving the motor 64 thereby rotating the atmosphere shielding member 60 about the vertical axis J along with the rotary shaft 61.

A contact/separation mechanism 67 vertically moves the support arm 62 for bringing the atmosphere shielding part 60 into contact with the spin chuck 1 or separating the former from the latter by vertical movement of the support arm 62. This apparatus 100 is so formed that the atmosphere shielding part 60 is vertically movable between three stages of positions, i.e., a proximal position for sucking the substrate W held by the spin chuck 1, a processing position for sucking/holding the substrate W and slightly separating from the spin chuck 1 upward and an upper position remarkably separating from the spin chuck 1. The contact/separation mechanism 67 implementing such contact/separation movement is formed by a mechanism employing a screw shaft or the like similarly to the vertical moving mechanism 40, or an air cylinder. As shown in FIG. 4, the control part 50 also performs this contact/separation control.

Referring to FIG. 1 again, a solution supply pipe 70 passes through a central opening of the atmosphere shielding part 60 and the hollow portion of the rotary shaft 61, so that the processing solution can be supplied to a portion around the rotation center from a liquid supply part 70a provided on its lower end for processing the upper surface of the substrate W held by the spin chuck 1. The solution supply pipe 70 is communicatively connected to a pipe 71. The base end of the pipe 71 is so branched that a chemical solution supply source 9 is communicatively connected to a first branch pipe 71a and a deionized water supply source 10 is communicatively connected to a second branch pipe 71b. The branch pipes 71a and 71b are provided with on-off valves 72a and 72b respectively so that the solution supply part 70a can selectively switch and supply the chemical solution and the deionized water by switching the on-off valves 72a and 72b.

The clearance between the inner wall surfaces of the central opening of the atmosphere shielding part 60 and the hollow portion of the rotary shaft 61 and the outer wall surface of the solution supply pipe 70 defines a gas supply passage 73. The gas supply passage 73 is communicatively connected to a gas supply source 15 through a pipe 75 provided with an on-off valve 74, so that clean gas or inert gas can be supplied from a gas supply part 73a provided on the lower end of the gas supply passage 73 to the space between the atmosphere shielding part 60 and the upper surface of the substrate W.

The control part 50 is formed to also perform control such as rotation control of the spin chuck 1, rotation control of the atmosphere shielding part 60, supply control of the detergent from the solution supply parts 7a and 70a, supply control of the gas from the gas supply parts 12a and 73a, gas supply control of controlling the quantity of gas injection for suction control of the substrate W and the like in addition to vertical movement control of the guide member 30 and contact/separation control of the atmosphere shielding part 60, as shown in FIG. 4.

Figure 5A:
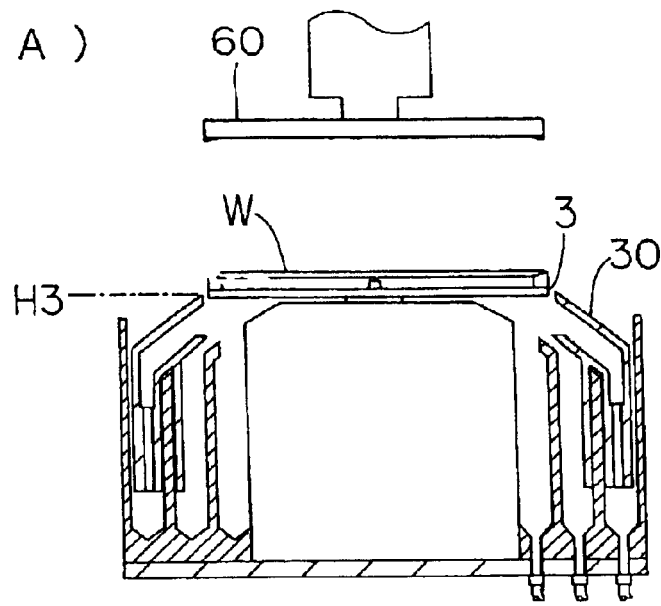
FIGS. 5(A), 5(B) and 5(C) are explanatory diagrams showing a state of transferring a substrate to a spin chuck, a state of chemical solution processing and a state of rinsing processing and drying processing respectively for illustrating operations of the apparatus according to the first embodiment.
Figure 5B:
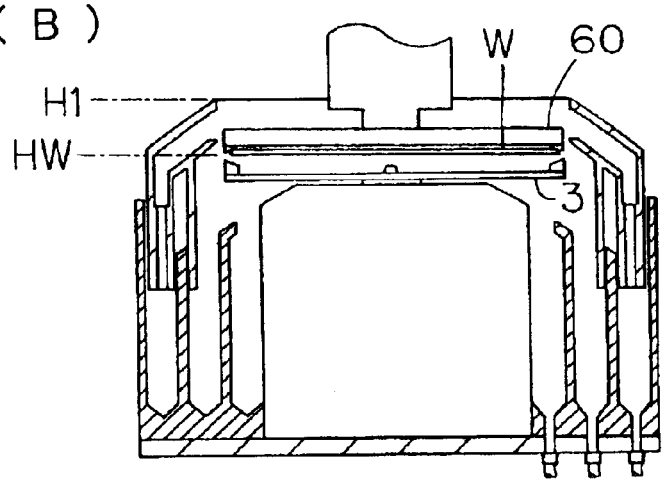
Figure 5C:
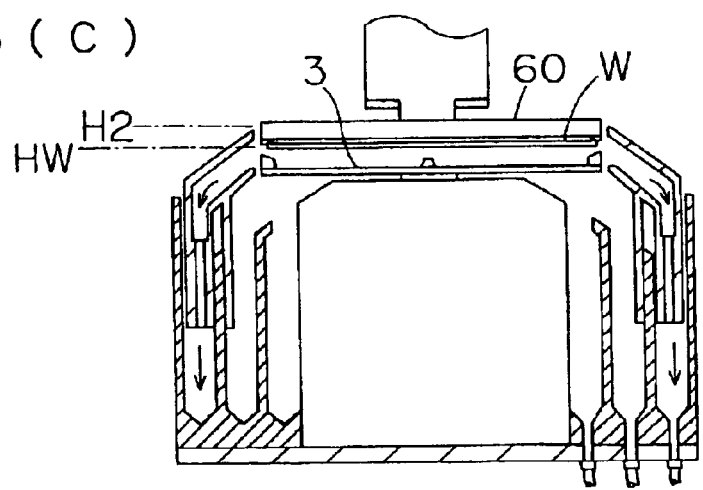

Operations of the apparatus 100 having the aforementioned structure are described with reference to FIGS. 5(A) to 5(C). FIG. 5(A) shows a state of transferring the substrate W to the spin chuck 1, FIG. 5(B) shows a state of chemical solution processing, and FIG. 5(C) shows a state of rinsing processing and drying processing. It is exemplarily assumed that the substrate W is plated on its upper surface and the apparatus 100 aims at performing processing of etching and removing the peripheral portion of the upper surface by about several mm.

The overall flow of the processing steps is now schematically described. First, the control part 50 controls the contact/separation mechanism 67 for moving up the atmosphere shielding part 60 when introducing an unprocessed substrate W into the spin chuck 1, as shown in FIG. 5(A). Thus, the atmosphere shielding part 60, the solution supply pipe 70 provided in relation thereto, the pipe 71 and the like are moved up. The control part 50 controls the vertical moving mechanism 40 for moving down the guide member 30 to the third vertical position H3 while locating the atmosphere shielding part 60 on the upper position for spreading the space between the atmosphere shielding part 60 and the spin chuck 1. Thus, an introduction path for the substrate W is ensured between the atmosphere shielding part 60 and the spin base 3.

In this state, a substrate transport robot (not shown) transfers the unprocessed substrate W to the spin chuck 1. The spin chuck 1 holds the received substrate W. A substrate holding hand of the substrate transport robot enters the spin chuck 1, places the unprocessed substrate W on the holding pins 4, and thereafter retreats from the spin chuck 1. In this process, the guide upstanding surfaces 4b of the holding pins 4 drop the substrate W onto the supporting surfaces 4a, as described above.

When completely receiving the substrate W, the control part 50 controls the contact/separation mechanism 67 for moving down the atmosphere shielding part 60, as shown in FIG. 5(B). Thus, it follows that the atmosphere shielding part 60 is opposed to the substrate W on the proximal position with a prescribed clearance.

Figure 6A:
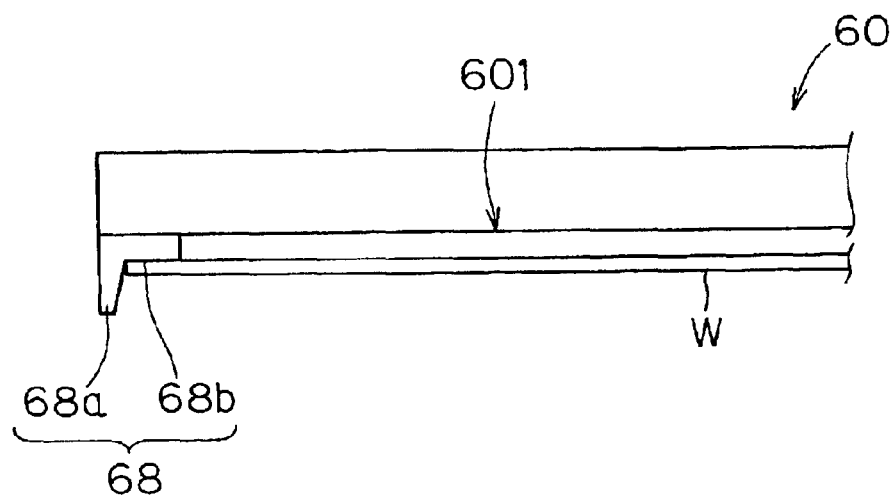
FIGS. 6(A) and 6(B) illustrate switching of a substrate suction state of the atmosphere shielding part.

Then, the gas supply part 607 of the atmosphere shielding part 60 supplies a prescribed quantity of nitrogen gas to develop Bernoulli effect between the shielding surface 601 and the substrate W. Thus, it follows that the atmosphere shielding part 60 supports the substrate W from above as shown in FIG. 6(A), so that the peripheral portion of the substrate W comes into contact with the contact supporting surfaces 68b of the support members 68 for locating the substrate W and the shielding member 602 covers the upper surface thereof. The atmosphere shielding part 60 sucking/supporting the substrate W is moved up to slightly separate from the spin chuck 1 and located on the processing position.

The control part 50 further moves up the guide member 30 to locate the same on the first vertical position H1 while synchronously rotating the motors 6 and 64 by supplying a common driving/control signal. The motors 6 and 64 are rotated oppositely to each other. Thus, it follows that the upper and lower rotary shafts 2 and 61 are rotated in the same direction so that the spin base 3 and the atmosphere shielding part 60 fixed to the rotary shafts 2 and 61 are integrally synchronously rotated about the vertical axis J passing through the centers thereof. Therefore, it follows that the substrate W held by the atmosphere shielding part 60 is rotated about the vertical axis J passing through a substantially central portion thereof in a horizontally held state. At this time, the contact supporting surfaces 68b of the support members 68 come into contact with the peripheral portion of the substrate W sucked by the atmosphere shielding part 60 thereby implementing transmission of the torque from the motor 64 to the substrate W. In other words, the contact supporting surfaces 68b of the support members 68 come into contact with the upper surface of the peripheral portion of the substrate W to be pressed by the upper surface of the peripheral portion when the atmosphere shielding part 60 sucks the substrate W, thereby transmitting the rotational driving force of the motor 64 to the substrate W. On the other hand, the upstanding surfaces 68a of the support members 68 come into contact with the outer peripheral end surface of the substrate W when the atmosphere shielding part 60 sucks the substrate W, to regulate the horizontal position of the substrate W.

Then, the control part 50 supplies the chemical solution to the lower surface of the substrate W from the solution supply part 7a while the atmosphere shielding pat 60 rotates the substrate W. In other words, the control part 50 opens the on-off valve 11a, thereby discharging an etching solution serving as a cleaning chemical solution from the solution supply part 7a of the solution supply pipe 7. Thus, the etching solution is supplied to the center of the lower surface of the substrate W at close range. The supplied etching solution is guided to the outer side of the direction of the radius of gyration due to the centrifugal force following rotation of the substrate W, whereby the overall lower surface of the substrate W can be thoroughly cleaned with the chemical solution as a result.

At this time, the atmosphere shielding part 60 shields an effective area (formed with a device pattern) of the upper surface of the substrate W in a non-contact manner while locating the peripheral portion thereof according to the present invention. Also when the processing solution is injected toward the lower surface, therefore, the substrate W is not convexly bent but can maintain a clearance between the same and the shielding member 602. In order to cope with the injection pressure of the processing solution on the central portion of the substrate W, the control part 50 may also supply gas from the gas supply passage 73 to develop the Bernoulli effect.

Figure 6B:
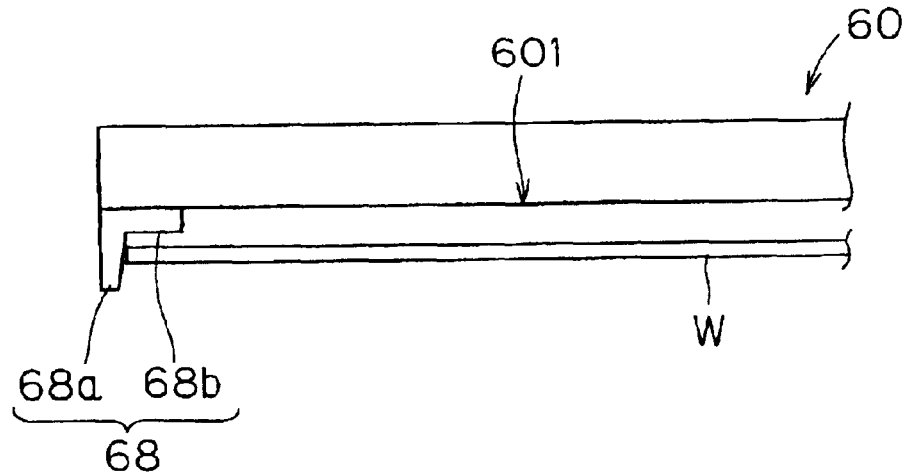

Then, the etching solution reaching the peripheral portion of the lower surface of the substrate W creeps up to the upper surface of the substrate W to process the peripheral portion of the upper surface. At this time, the control part 50 etches the portions in contact with the contact supporting surfaces 68b as follows:

The control part 50 reduces the quantity of the gas supplied from the gas supply part 607, thereby reducing the quantity of injection from the injection ports 604. Consequently, suction force resulting from the Bernoulli effect is weakened to spread the space between the substrate W and the shielding surface 601 as shown in FIG. 6(B). Thus, the substrate W is brought into a proximity suction state separated from the contact supporting surfaces 68b by a prescribed space. In other words, the control part 50 controls the gas supply part 607 to attain such a quantity of gas injection that the atmosphere shielding part 60 sucks the substrate W while the upper surface of the peripheral portion of the substrate W is separated from the contact supporting surfaces 68b of the support members 68 by the prescribed space.

Hence, it follows that the etching solution from the solution supply part 7a touches the lower surface of the rotated substrate W thereby producing resistance, so that the substrate W held in a non-contact state with the contact supporting surfaces 68b of the support members 68 is rotated in a delay from the rotation of the atmosphere shielding part 60. In other words, the upstanding surfaces 68a of the support members 68 prevent the substrate W from horizontal popping while the peripheral end surface of the substrate W buts against the upstanding surfaces 68a so that the substrate W is rotated at a smaller rotational frequency than the atmosphere shielding part 60 due to the torque from the atmosphere shielding part 60.

Thus, the rotational frequencies of the substrate W and the atmosphere shielding part 60 differ from each other and the substrate W starts to slide. It follows that suction and the aforementioned sliding are so repeated as to change the positions of the substrate W coming into contact with the contact supporting surfaces 68b of the support members 68. The control part 50 continuously supplies the etching solution from the solution supply part 7a to the lower surface of the substrate W before and after changing the positions coming into contact with the contact supporting surfaces 68b, so that the etching solution directed toward the peripheral portion of the lower surface of the substrate W thoroughly creeps up to the upper surface of the substrate W to homogeneously etch the peripheral portion of the upper surface. Thus, irregular processing resulting from holding can be prevented. During this chemical solution processing period, the on-off valve 11b is closed.

In this chemical solution processing, it follows that the chemical solution splashed from the outer peripheral portion of the rotated substrate W toward the periphery is received by the inclined portion 31a, guided to the first discharge tank 24a along the inclined portion 31a and the vertical portion 33, discharged from the first discharge port 28a and recovered in the recovery tank through the recovery drain 27.

The etching solution supplied from the chemical solution supply source 9 to the substrate W can be prepared from HF, BHF (dilute hydrofluoric acid), $H_3PO_4$, $HNO_3$, $HF+H_2O_2$ (hydrofluoric acid peroxide), $H_3PO_4+H_2O_2$ (phosphoric acid peroxide), $H_2SO_4+H_2O_2$ (sulfuric acid peroxide), $HCl+H_2O_2$ (hydrochloric acid peroxide), $H_3PO_4+CH_3COOH+HNO_3$, iodine+ammonium iodide, organic acid such as oxalic acid or citric acid, or organic alkali such as TMAH (tetramethylammonium hydroxide) or choline.

Further, it follows that part of the chemical solution scattered from the substrate W to hit the inclined portion 31a forms mist to float. However, this apparatus 100 having the atmosphere shielding part 60 arranged at the prescribed space from the upper surface of the substrate W to cover the portion above the substrate W can inhibit such mist from flowing toward the upper surface of the substrate W. Therefore, the mist of the chemical solution can be inhibited from re-adhering to the substrate W.

When a prescribed chemical solution cleaning processing time elapses, the control part 50 closes the on-off valve 11*a* for stopping supplying the etching solution from the solution supply part 7*a*. As shown in FIG. 5(C), the control part 50 locates the guide member 30 on the second vertical position H2 while keeping the atmosphere shielding part 60 on the processing position, for locating the inclined portion 31*b* of the guide member 30 on the vertical position HW of the substrate W held by the atmosphere shielding part 60.

Thereafter the control part 50 opens the on-off valve 11*b*. Thus, it follows that the solution supply part 7*a* supplies a rinsing solution (deionized water, ozone water, electrolytic ion water or the like) toward the center of the lower surface of the substrate W. In this state, the control part 50 performs rinsing processing of supplying the rinsing solution from the solution supply part 7*a* to the lower surface of the substrate W for cleaning off the chemical solution adhering to the substrate W with the deionized water. The control part 50 repeats suction of the substrate W and the aforementioned sliding in this order also during the rinsing processing. Thus, part of the chemical solution adhering to the peripheral portion of the upper surface of the substrate W is also thoroughly cleaned off. A rinsing step for cleaning off the etching solution present on the lower surface of the substrate W processed with the chemical solution is carried out in the aforementioned manner.

In this rinsing processing, it follows that the waste water (deionized water mixed with the chemical solution) scattered from the outer peripheral portion of the rotated substrate W to the periphery is received by the inclined portion 31*b*, guided to the second discharge tank 24*b* through the opening 35 along the inclined portion 31*b* and the vertical portion 34*b*, discharged from the second discharge port 28*b* and discarded through the waste drain 29.

While part of the waste water scattered from the substrate W to hit the inclined portion 31*b* floats as mist, the waste water can be preferably inhibited from re-adhering to the substrate W due to action similar to that in the case of the chemical solution processing.

After supplying the rinsing solution by a predetermined constant time, the control part 50 closes the on-off valves 11*b* and 72*b* to terminate the rinsing step. Then, the control part 50 supplies a control signal for rotating the motors 7 and 64 at a high speed. Thus, the control part 50 acceleratedly rotates the substrate W for centrifugally draining a solution component from its surface. Thus, the control part 50 carries out a drying step. At this time, the control part 50 increases the quantity of the gas supplied from the gas supply part 607 and brings the peripheral portion of the substrate W into contact with the support members 68 so that the atmosphere shielding part 60 reliably holds the substrate W.

At this drying step, the control part 50 opens the on-off valve 13 for supplying nitrogen gas from the gas supply part 12*a* to the lower surface of the substrate W. Thus, air in a limited small-volume space between the substrate W and the spin base 3 is quickly replaced with the nitrogen gas, whereby no undesired oxide film grows on the upper or lower surface of the cleaned substrate W.

After termination of the drying step, the control part 50 stops supplying the gas from the gas supply part 607 for releasing the substrate W from suction/supporting, and transfers the substrate W from the atmosphere shielding part 60 to the spin chuck 1. The control part 50 stops rotation of the motors 6 and 64, further moves the atmosphere shielding part 60 to the upper position by the contact/separation mechanism 67 as shown in FIG. 5(A), and thereafter moves down the guide member 30 to the third vertical position H3. In this state, it follows that the substrate transport robot receives the cleaned and dried substrate W from the holding pins 4 and discharges the same from the spin chuck 1. Thus, rotation processing for the single substrate W is terminated.

According to the aforementioned embodiment, the substrate processing apparatus 100 is an apparatus performing substrate processing while rotating the substrate W such as a semiconductor wafer in a horizontal plane. The support members 68 reliably regulate the space between the upper surface of the substrate W and the atmosphere shielding part 60, whereby the atmosphere shielding part 60 and the substrate W do not collide with each other. Therefore, the space between the atmosphere shielding part 60 and the upper surface of the substrate W can be readily reduced. Thus, peripheral particles can be prevented from adhering to the surface of the substrate W by sufficiently reducing this space. The space around the substrate W can be effectively limited, whereby the periphery of the substrate W can be quickly brought into a nitrogen gas atmosphere. Thus, rotation processing of the substrate W can be excellently performed.

Further, the substrate processing apparatus 100 performs processing of strongly sucking the substrate by Bernoulli effect, reliably bringing the same into contact with the support members 68 and holding/rotating the same and processing of reducing the quantity of gas injection for weakening the Bernoulli effect and proximately holding the substrate W without brining the same into contact with the support members 68 for rotating the same while making the same start sliding with respect to the atmosphere shielding part 60. Therefore, homogeneous processing can be performed while preventing irregular processing resulting from substrate holding.

In addition, the substrate processing apparatus 100 switches the holding state of the substrate W by controlling the Bernoulli effect, whereby no complicated driving mechanism is required for operating mechanical chucks as compared with a case of uprightly providing the mechanical chucks for grasping the peripheral end surface of the substrate W, for example, and hence the structure is extremely simplified. Further, the number of members having large air resistance is small as compared with the case of employing mechanical chucks, whereby turbulence of air current around the atmosphere shielding part 60 is small. Thus, formation of mist or lifting of particles can be effectively prevented, whereby the processing quality for the substrate W can be improved.

2. Second Embodiment

A second embodiment of the present invention is now described. A substrate processing apparatus according to the second embodiment is absolutely identical in structure and schematic procedure to the substrate processing apparatus 100 according to the first embodiment. The second embodiment is different from the first embodiment only in a technique of changing portions of a substrate W coming into contact with contact supporting surfaces 68*b* of support members 68 in suction while the remaining points of the former are identical to those of the latter, and hence redundant description is omitted.

The substrate processing apparatus 100 according to the first embodiment weakens the Bernoulli effect and relatively slides the substrate W with respect to the atmosphere shielding part 60 thereby changing the positions of the substrate W coming into contact with the contact supporting surfaces 68b in suction. The substrate processing apparatus according to the second embodiment temporarily cancels suction by an atmosphere shielding part 60, transfers the substrate W to a spin chuck 1 and relatively rotates the spin chuck 1 with respect to the atmosphere shielding part 60, thereby changing the positions of the substrate W coming into contact with the contact supporting surfaces 68b in suction.

More specifically, the substrate processing apparatus rotates the substrate W while making the atmosphere shielding part 60 suck/support the substrate W by Bernoulli effect similarly to the aforementioned embodiment, for supplying an etching solution to the lower surface of the substrate W and performing bevel etching. After performing this processing for a prescribed time, a control part 50 stops rotation of motors 6 and 64. The control part 50 stops supplying gas from a gas supply part 607 and release the substrate W from suction/supporting by the atmosphere shielding part 60. The spin chuck 1 receives the substrate W released from the sucked state, and holding pins 4 hold the same.

Thereafter the control part 50 drives an electric motor 6 for slightly rotating the spin chuck 1 while keeping the atmosphere shielding part 60 stopped. At this time, the substrate W is rotated by a quantity exceeding contact areas by the contact supporting surfaces 68b of the support members 68 so that a contact position by a certain support member 68 does not come into contact with an adjacent support member 68. Thus, it follows that the positions of the substrate W coming into contact with the contact supporting surfaces 68b of the support members 68 are changed in suction.

Then, the control part 50 slightly rotates the substrate W, thereafter sucks the substrate W to the atmosphere shielding part 60 again and supplies the etching solution to the lower surface for performing bevel etching. The control part 50 repeats such a series of steps at need. The control part 50 supplies the etching solution from a solution supply part 7a to the lower surface of the substrate W before and after changing the positions coming into contact with the contact supporting surfaces 68b, so that the etching solution directed toward the peripheral portion of the lower surface of the substrate W thoroughly creeps up to the upper surface of the substrate W for homogeneously etching the peripheral portion of the upper surface. Thus, irregular processing resulting from holding can be prevented.

3. Third Embodiment

Figure 7:
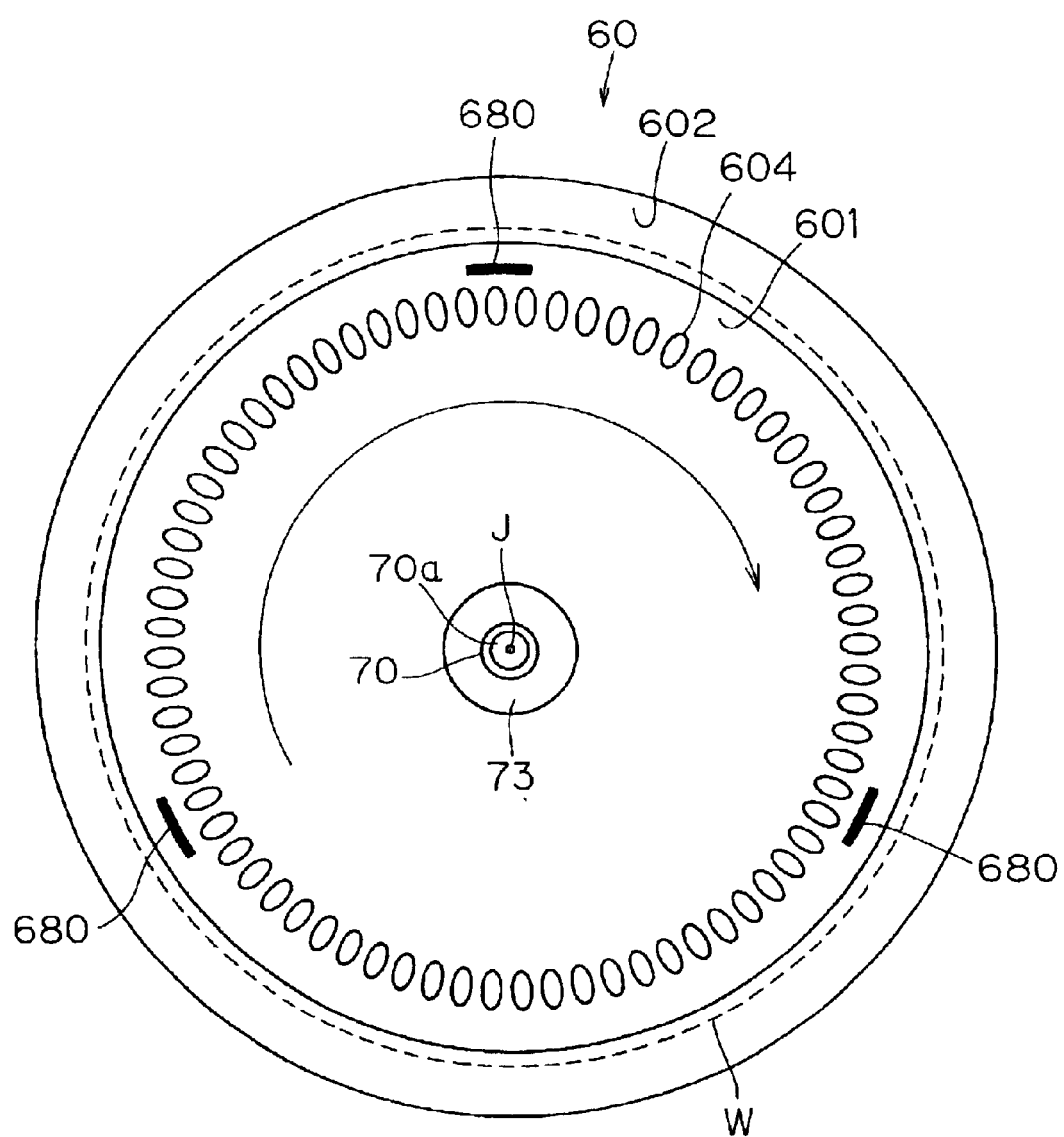
FIG. 7 is a bottom plan view of an atmosphere shielding part in a substrate processing apparatus according to a third embodiment of the present invention.

A third embodiment of the present invention is now described. A substrate processing apparatus according to the third embodiment is different from the substrate processing apparatus 100 according to the first embodiment in shapes and mounted positions of support members 680 while the remaining parts of the former are identical to those of the latter, and hence redundant description is omitted. FIG. 7 is a bottom plan view of an atmosphere shielding part 60 according to the third embodiment. Referring to FIG. 7, members identical to those in the first embodiment are denoted by the same reference numerals.

The support members 680 according to the third embodiment are projectingly provided on a shielding surface 601 of a shielding member 602. At least three such support members 680 having arcuate shapes partially forming a concentric circle of the circumference of a substrate W are provided on the concentric circle of the shielding surface 601 at regular intervals.

Figure 8:
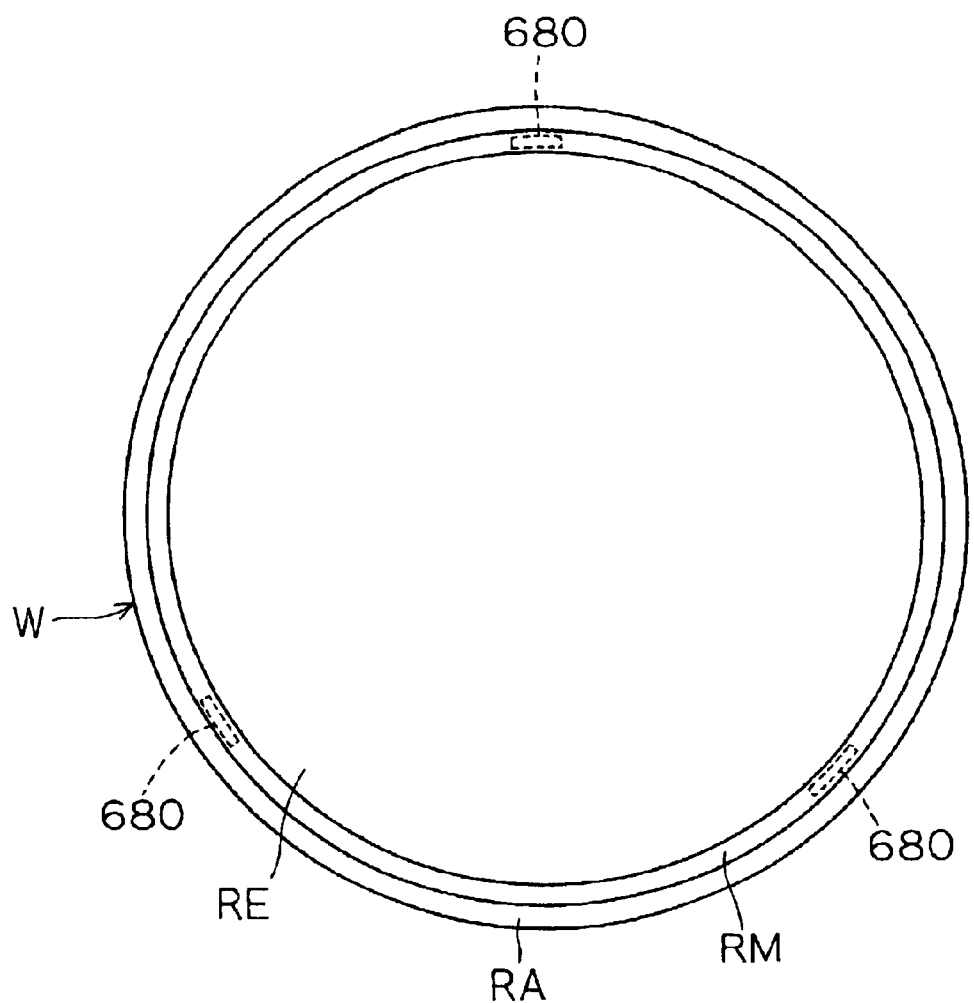
FIG. 8 illustrates a position where a support member of the atmosphere shielding part comes into contact with a substrate.
Figure 9:
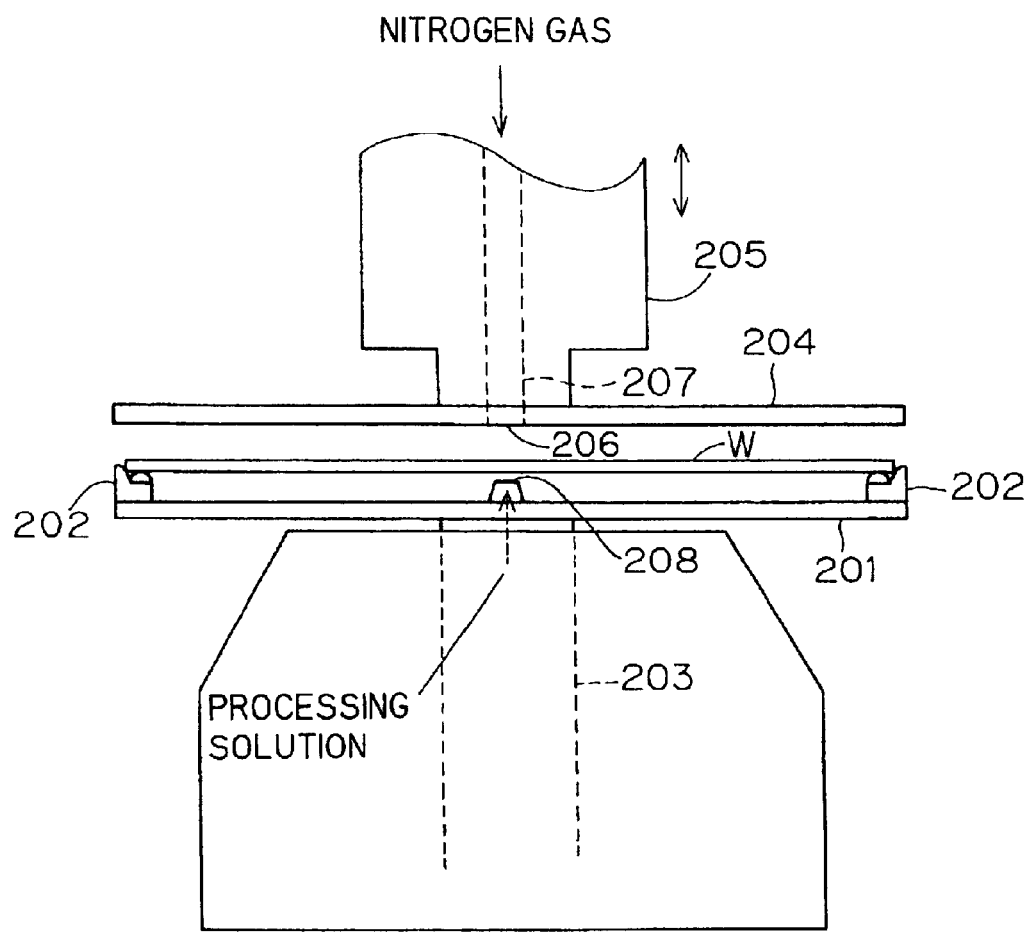
FIG. 9 schematically illustrates an exemplary structure of a principal part of a conventional substrate processing apparatus.
Figure 10:
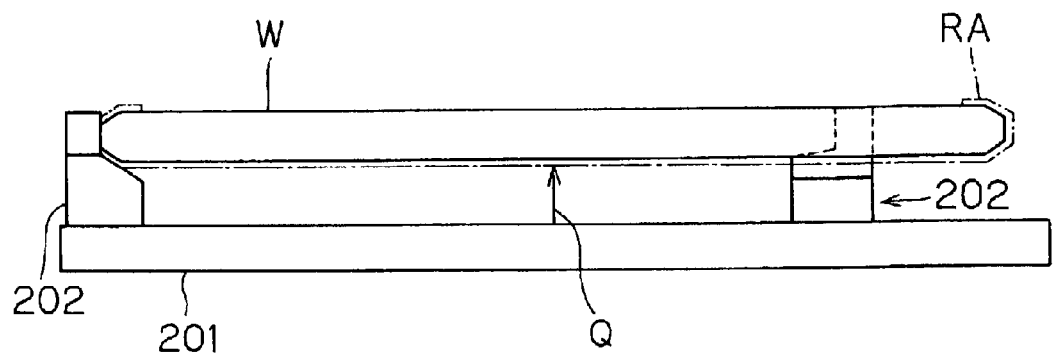
FIG. 10 is a side elevational view showing problems in a conventional method.

A device pattern is formed not on the overall surface of the substrate W such as a semiconductor wafer. In other words, an effective area RE formed with the device pattern is an inner area separated from the edge of the substrate W by a constant distance, as shown in FIG. 8. On the other hand, a peripheral area RA processed with an etching solution supplied to the lower surface of the substrate W in bevel etching to reach the upper surface of the peripheral portion of the substrate W for processing the same is limited to a constant distance from the edge of the substrate W. When adjusting the rotational frequency of the substrate W for narrowing the peripheral area RA in bevel etching for protecting a device present on the effective area, it follows that an area RM in a clearance between the effective area RE and the etching area RA, i.e., a clearance area RM neither formed with the device pattern nor subjected to etching processing is present on the upper surface of the substrate W.

When injecting nitrogen gas from injection ports 604 and sucking the substrate W to the atmosphere shielding part 60 by Bernoulli effect in the third embodiment, the forward end of each support member 680 comes into contact with the clearance area RM between the peripheral area RA and the effective area RE. In the third embodiment, therefore, the peripheral area RA can be homogeneously etched while protecting the effective area RE formed with the device pattern by simply supplying the etching solution to the lower surface of the substrate W and performing bevel etching while rotating the substrate W in a state sucked/supported by the atmosphere shielding part 60 due to the Bernoulli effect. In other words, the etching solution supplied to the lower surface of the substrate W thoroughly creeps up to the upper surface of the substrate W and homogeneously etches the peripheral portion of the upper surface also when the support members 680 are in contact with the clearance area RM of the substrate W without changing the positions of the substrate W coming into contact with the contact supporting surfaces 68b dissimilarly to the first and the second embodiment. Therefore, irregular processing resulting from holding can be prevented.

4. Modifications

The present invention is not restricted to the aforementioned embodiments but can be carried out in other modes as follows:

(1) In the processing employing the chemical solution in each of the aforementioned embodiments, the spin chuck 1 may not be rotated or the gas may be supplied from the gas supply parts 12a and 73a at need. For example, the space between the substrate W and the shielding surface 601 can be spread without reducing the total quantity of gas by reducing the quantity of injection from the injection ports 604 while supplying the gas from the gas supply passage 73. In this case, the space between the substrate W and the shielding surface 601 can be controlled without reducing the action of preventing lifting of mist or the like.

(2) While each of the aforementioned embodiments aims at performing etching processing, the present invention is similarly applicable to various types of substrate processing apparatuses supplying other processing solutions to substrates W and performing prescribed processing on the substrates W.

(3) While the apparatus according to each embodiment comprises three support members, the number of the support members is not restricted to three so far as the same is at least three.

(4) While the support members 68 are uprightly provided on the lower surface of the atmosphere shielding part 60 in each of the aforementioned embodiments, the lower surface of the atmosphere shielding part 60 may alternatively be integrally projected for forming the support members 68. In other words, projections may be formed on the lower surface of the atmosphere shielding part 60 and the forward ends of the projections may be brought into contact with the surface of the substrate W thereby sucking/holding the substrate W at a prescribed space.

(5) While the apparatus according to each of the aforementioned embodiments cleans a semiconductor wafer, the present invention is also applicable to an apparatus performing processing other than cleaning, and similarly applicable to an apparatus processing various substrates such as a glass substrate for a liquid crystal display, a glass substrate for a photomask and a substrate for an optical disk in addition to the wafer.

Au reste, various design variations can be made within the range of technical items described in the scope of claim for patent.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus constructed to process a substrate by supplying a processing solution to said substrate while rotating the same, comprising:

a proximity suction part constructed to inject gas between an upper surface of said substrate and a supporting surface of said proximity suction part from a hole provided on said supporting surface opposed to the upper surface of said substrate thereby sucking said substrate through the Bernoulli effect;

a rotation part rotating said proximity suction part about a vertical axis;

a support member uprightly provided on said supporting surface of said proximity suction part for contacting with a peripheral upper surface of said substrate in a manner enabling transmitting a rotational driving force of said rotation part to said substrate when said proximity suction part contacts said substrate; and a processing solution supply part supplying a processing solution to a lower surface of said substrate rotated in contact with said support member.

2. The substrate processing apparatus according to claim 1, wherein said support member has:

a contact supporting surface coming into contact with the peripheral upper surface of said substrate, and an upstanding surface coming into contact with an outer peripheral end surface of said substrate for regulating the horizontal position of said substrate when said proximity suction part sucks said substrate.

3. The substrate processing apparatus according to claim 2, further comprising a contact position changing part changing the position of said substrate coming into contact with said contact supporting surface, wherein said processing solution supply part supplies said processing solution to said substrate before and after changing said position coming into contact with said contact supporting surface.

4. The substrate processing apparatus according to claim 3, wherein said contact position changing part includes:

a gas supply part adjusting the quantity of gas injection from said hole, and a gas injection quantity control part controlling said gas supply part to adjust a quantity of gas injection for sucking said substrate to said proximity suction part while separating said peripheral upper surface from said contact supporting surface of said support member at a prescribed space.

5. The substrate processing apparatus according to claim 3, wherein said contact position changing part includes:

a holding part receiving and holding said substrate released from suction by said proximity suction part, and a rotation part rotating said holding part.

6. The substrate processing apparatus according to claim 2, wherein said support member comprises a plurality of uprightly provided members spacedly arranged along the periphery of said supporting surface.

7. A substrate processing apparatus constructed to process a substrate by supplying a processing solution to said substrate while rotating the same, comprising:

a proximity suction part constructed to inject gas between an upper surface of said substrate and a supporting surface of said proximity suction part from a hole provided on said supporting surface opposed to the upper surface of said substrate thereby sucking said substrate through the Bernoulli effect;

a rotation part rotating said proximity suction part about a vertical axis;

a support member uprightly provided on said supporting surface of said proximity suction part for contacting with the upper surface of said substrate when said proximity suction part sucks said substrate thereby transmitting the driving force of said rotation part to said substrate; and a processing solution supply part supplying a processing solution to a lower surface of said substrate rotated in contact with said support member, wherein said support member is so arranged that a forward end of said support member comes into contact with a clearance between a processing area where said processing solution supplied to the lower surface of said substrate reaches a peripheral upper surface of said substrate for performing processing and an effective area where a device pattern is formed when said proximity suction part sucks said substrate.

8. The substrate processing apparatus according to claim 7, wherein said support member comprises a plurality of uprightly provided members spacedly arranged along the periphery of said supporting surface.

* * * * *